(12) United States Patent
Komaya et al.

(10) Patent No.: US 10,002,705 B2
(45) Date of Patent: Jun. 19, 2018

(54) COIL DEVICE

(71) Applicant: TDK CORPORATION, Tokyo (JP)

(72) Inventors: Yuma Komaya, Tokyo (JP); Hiroshi Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days. days.

(21) Appl. No.: 15/804,387

(22) Filed: Nov. 6, 2017

(65) Prior Publication Data

US 2018/0130597 A1  May 10, 2018

(30) Foreign Application Priority Data

Nov. 9, 2016 (JP) ................................ 2016-219228

(51) Int. Cl.
| H05K 1/16 | (2006.01) |
| H01F 27/29 | (2006.01) |
| H01F 27/28 | (2006.01) |
| H01F 27/24 | (2006.01) |
| H05K 1/18 | (2006.01) |
| H01F 1/36 | (2006.01) |

(52) U.S. Cl.
CPC .......... *H01F 27/292* (2013.01); *H01F 27/24* (2013.01); *H01F 27/2828* (2013.01); *H05K 1/181* (2013.01); *H01F 1/36* (2013.01); *H05K 2201/1003* (2013.01)

(58) Field of Classification Search
CPC ...... H01F 27/292; H01F 27/2828; H01F 1/36; H01F 27/24; H05K 2201/1003; H05K 1/181
USPC ....................................................... 174/260
See application file for complete search history.

(56) References Cited

U.S. PATENT DOCUMENTS

| 6,154,113 | A | * | 11/2000 | Murai | ................ | H01F 27/2828 336/192 |
| 6,157,283 | A | * | 12/2000 | Tsunemi | ............... | H01F 27/292 336/192 |
| 6,960,976 | B2 | * | 11/2005 | Fan | ........................ | H01F 17/045 336/192 |
| 2006/0071749 | A1 | * | 4/2006 | Aoki | ..................... | H01F 17/045 336/83 |
| 2006/0267719 | A1 | * | 11/2006 | Yasuda | ................. | H01F 17/045 336/223 |
| 2008/0003864 | A1 | * | 1/2008 | Hatakeyama | ......... | H01F 17/045 439/399 |
| 2015/0042436 | A1 | * | 2/2015 | Arimitsu | ................ | H01F 27/29 336/192 |
| 2015/0084731 | A1 | * | 3/2015 | Takagi | .................... | H01F 19/08 336/212 |

(Continued)

FOREIGN PATENT DOCUMENTS

JP          2013-191694 A          9/2013

*Primary Examiner* — Sherman Ng

(74) *Attorney, Agent, or Firm* — Oliff PLC

(57) ABSTRACT

Provided is coil device 1 including: core 10 including winding core part 12 and flange parts 14*a*, 14*a* provided on both edges of winding core part 12, and coil part 30 including wires 31, 32 wound on winding core part 12. Electrode film 40, having wire connecting part 41 where wire edges 31*a*, 31*b*, 32*a*, 32*b* are connected, and formed on a surface of the flange parts 14*a*, 14*a*. Metal terminal 50 is connected to a terminal fitting part 42 formed on a surface of electrode film 40 at a place different from the wire connecting part. According to the invention, a coil device having a high reliability for bonding at mounting part can be provided.

6 Claims, 12 Drawing Sheets

(56) References Cited

U.S. PATENT DOCUMENTS

2015/0235758 A1* 8/2015 Takagi ............... H01F 27/2828
336/192

* cited by examiner

COIL DEVICE

BACKGROUND OF THE INVENTION

1. Field of the Invention

The present invention relates to a coil device, particularly to a surface mounting type coil device, used as an inductor, etc.

2. Description of the Related Art

Coil device mentioned in Patent Document 1 is known as a conventional surface mounting type coil device. The coil device provides a coil, wound with a wire, and a metal terminal where a terminal part of the coil is bonded. The metal terminal is provided with a bonding surface of a solder when reflow soldering the coil device to a circuit board, and the terminal part of the coil is bonded to a part of the bonding surface of the solder by thermocompression.

In case when the thermocompression is applied to the metal terminal, an adhesion of the solder becomes difficult at a part where thermocompression is applied. According to the metal terminal of Patent Document 1, thermocompression is applied to a part of the bonding surface of the solder. Thus, solder does not sufficiently adhere when reflow soldering the coil device to the circuit board, and a bonding strength of the solder tends to be insufficient.

In addition, further progression in reducing size and height of the coil device in the future makes it difficult to sufficiently secure the bonding area of the solder, and a bonding strength of the solder tends to further reduce.

Patent Document 1: JP 2013-191694A

DISCLOSURE OF THE INVENTION

Means for Solving the Problems

The present invention is produced in view of such actual circumstances, and an object thereof is to provide a coil device having a high reliability for bonding.

In order to achieve such object, the coil device of the invention includes:
- a core including a winding core part and a flange part provided on an edge of the winding core part,
- a coil part composed of a wire wound on the winding core part,
- an electrode film, having a wire connecting part where a wire edge of the wire is connected, and formed on a surface of the flange part, and
- a metal terminal, connected to a terminal fitting part formed on a surface of the electrode film at a place different from the wire connecting part.

The coil device of the invention includes the electrode film having the wire connecting part, where a wire edge of the wire composing the coil part is bonded, and the metal terminal bonded to the terminal fitting part, formed on a surface of the electrode film at a place different from the wire connecting part. The wire edge may be electrically bonded and fixed to the wire connecting part of the electrode film by such as thermocompression. In addition, the metal terminal may be suitably bonded to the electrode film at the terminal fitting part of the electrode film apart from the wire connecting part, by solder or a conductive adhesive.

Thus, the metal terminal can be soldered to such as a circuit board at a place apart from the wire connecting part of the electrode film. Therefore, a solderability to the metal terminal becomes good, and the bonding strength between the metal terminal and the circuit board improves. Due to this, the coil device becomes difficult to fall off from the circuit board, and a generation of the mounting defect can be effectively prevented.

Even if a crack is generated at the bonding surface of the solder, it will not affect the wire connecting part, physically separated from the mounting part. And there is a few risk for the wire to be disconnected at the wire connecting part. Thus, it becomes possible to prolong a product life of the coil device.

The coil device of the invention is possible to widen the area of the mounting part relative to the conventional ones, in which the wire edge is bonded to the metal terminal. Thus, the bonding strength of the solder can be highly secured. Thus, according to the coil device of the invention, a high reliability can be maintained even when a reduction in size and height is further progressed.

The metal terminal may be fixed to the flange part where the electrode film is not formed by an adhesion member such as a non-conductive adhesive. The metal terminal is bonded and fixed to the electrode film by a conductive adhesion member, solder, and etc. In addition, further fixation to the flange part by the adhesion member is possible to reinforce the bonding fixation between the electrode film and the metal terminal.

Preferably, the coil device of the invention may further includes a plate member having a flat external face. The flat external surface of the plate member becomes an adsorption surface for conveying the coil device. And for instance, when mounting on the circuit board, a coil device is likely to move on the circuit board by an adsorption conveyance device. The plate member can be composed of a magnetic body, similar to the core part composed of the magnetic body. In this case, the core part composes a closed magnetic path, and an inductance of the coil device can be enhanced.

The metal terminal preferably includes the mounting part, faced and bonded to the surface of the circuit board, and the mounting assistance part, continuously formed from the mounting part. Internal face of the mounting assistance part may be bonded to the terminal fitting part of the electrode film, or the internal face of the mounting part may be bonded to the same. Solder fillets are formed on the external face of the mounting assistance part when bonding the mounting part on the circuit board by solder, which improves the reliability of the bonding part at the metal terminal to the circuit board, which improves the reliability of the bonding part of the metal terminal to the circuit board.

The mounting part is disposed opposite to the wire connecting part, respectively located in the opposite sides of the flange part. Namely, when the flange part has an approximately rectangular parallelepiped shape, the wire connecting part is located on the surface, opposed to the surface where the mounting part is located.

With such configuration, the wire connecting part is arranged sufficiently separated from the arranged position of the mounting part, and a sufficient gap between the wire connecting part and the mounting part can be obtained. Thus, when the coil device reflow solders on the circuit board, the solder less adheres on the wire connecting part and the wire connecting part can be prevented contacting the circuit board, any obstacle, and etc. Thus, the situation such as a disconnection of the wire at the wire connecting part can be effectively prevented. Thus, a reliability of the coil device can be further enhanced.

The wire connecting part can be visually recognized even after the coil device is soldered on the circuit board. Thus, it becomes possible to recognize the existence of the disconnection at the wire connecting part.

The wire connecting part may be disposed adjacent to the mounting part on the same side of the flange part. The wire connecting part is not exposed to the exterior part with this configuration. Thus, the wire connecting part does not contact any obstacle after the coil device is soldered to the circuit board, and such as disconnection of the wire at the wire connecting part can be effectively prevented.

Arrangement of the wire connecting part adjacent to the mounting part makes the distance between the wire connecting part and the mounting part short, and that it can prevent unnecessary increase of a terminal fitting part area.

A pair of the metal terminal is provided on the flange part, and the wire connecting part can be arranged between the mounting part respectively formed on the pair of the metal terminals.

The wire connecting part can be arranged at the end face of the flange part. The place to arrange the wire connecting part is suitably determined depending on the mounting environment. By suitably varying the place of the wire connecting part according to the mounting environment, the place of the wire connecting part can be optimized.

DESCRIPTION OF THE PREFERRED EMBODIMENTS

Hereinafter, the present invention will be described in detail based on the embodiments shown by figures.

The First Embodiment

Figure 1A:
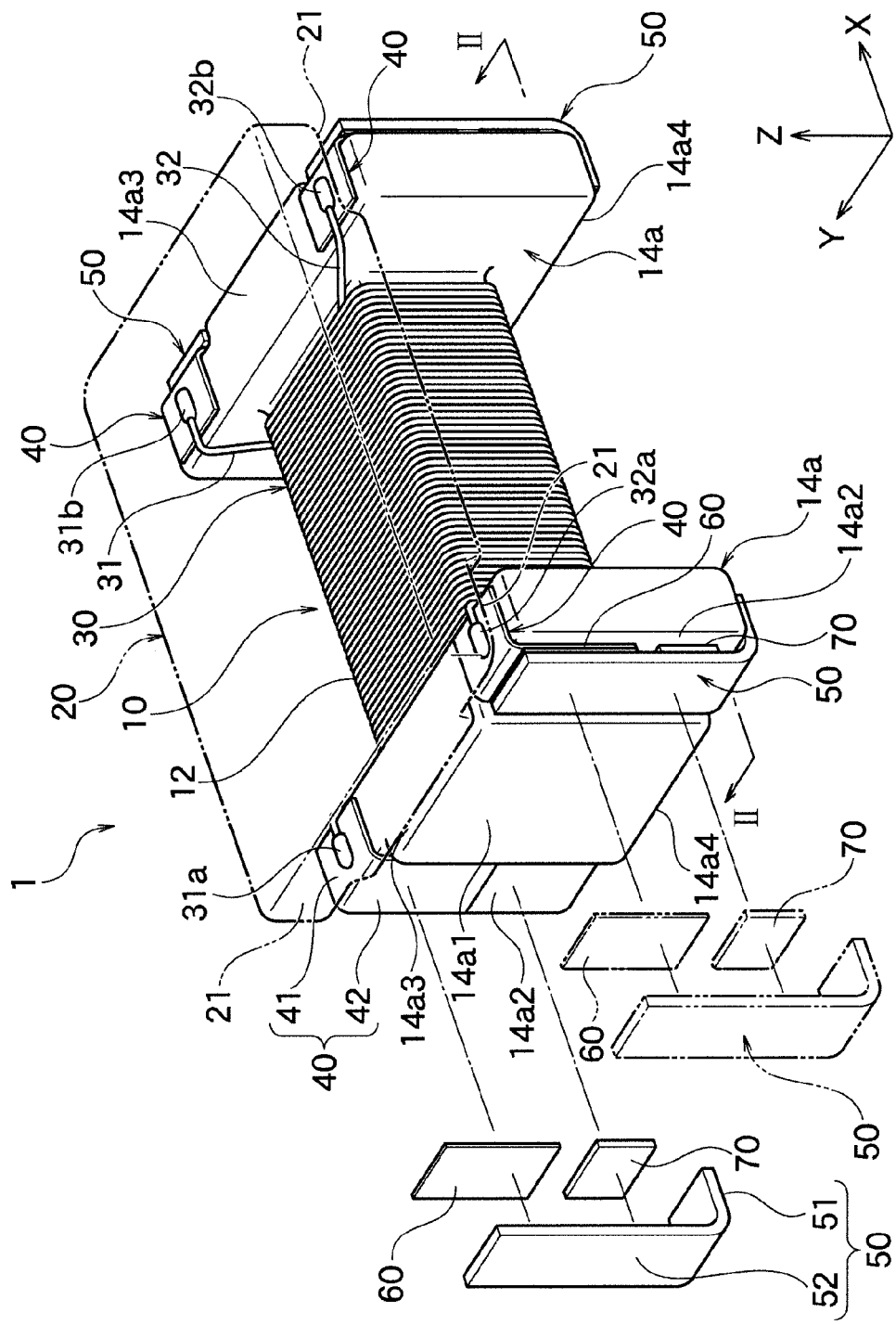
FIG. 1A is an entire perspective view of the coil device according to a first embodiment of the invention.

As shown in FIG. 1A, coil device 1 according to an embodiment of the invention includes a drum type core 10, plate member 20 and coil part 30, wound around winding core 12 of drum core 10.

According to coil device 1, a direction parallel to the winding shaft of winding core 12 of drum core 10 in a plane parallel to the mounting face where coil device 1 is mounted is determined X-axis, a direction vertical to X-axis which is in a plane parallel to the mounting face similar to X-axis is determined Y-axis, and a direction normal to the mounting face is determined Z-axis. Hereinafter, Z-axis positive direction side is determined upward and Z-axis negative direction side is determined downward.

The external dimension of coil device 1 is, for instance, 4.3 to 4.7 mm long in X-axis direction, 2.6 to 3.0 mm height in Z-axis direction, and 3.0 to 3.4 mm width in Y-axis direction, however, the size is not limited thereto.

Drum core 10 includes winding core 12, having a winding shaft in X-axis direction and having an elongated rectangular shaped cross section in Y-axis direction, and a pair of flange parts 14a, 14a, provided on both ends of winding core 12 in X-axis direction. Flange parts 14a, 14a are symmetrical with respect to a plane, which goes through a center of winding core 12 in X-axis direction and parallel to Y-axis and Z-axis. The cross sectional shape of winding core 12 is a rectangle according to the present embodiment, however, it may be a circle or approximately an octagon. The cross sectional shape is not particularly limited.

Each outer shape of flange parts 14a, 14a is an approximately rectangular parallelepiped shape, long in Y-axis. These flange parts 14a, 14a are placed with a prescribed interval in X-axis direction, mutually approximately parallel to each other. Although cross sectional shape of flange parts 14a, 14a is a rectangle according to the present embodiment, it may be a circle or approximately an octagon. Cross sectional shape thereof is not particularly limited. Winding core 12 is connected at a center part of each surface of flange parts 14a, 14a facing each other, and connects a pair of flange parts 14a, 14a.

As shown in FIG. 1A, winding core 12 is wound with the first wire 31 and the second wire 32, and composes coil part 30 wound with wires 31, 32 with one ore more layers. Wires 31, 32 are composed of such as a coated conductive wire, and has a configuration where a core material of a good conductor is coated with an insulating coated film. According to the present embodiment, a cross sectional area of the conductive part in wires 31, 32 may be the same or different. Coil part 30 may be wound with a wire by one or more layers, or may be wound with three or more wires by one or more layers.

According to the present embodiment, number of turns of wires 31, 32 are approximately the same, however, they can be different depending on the use. Note, said "number of turns of wires 31, 32 are approximately the same" defines that a ratio of these number of turns is within 0.75 to 1/0.75, and preferably 1.

As shown in FIG. 1A, step faces 14a2, 14a2, each recessed inwardly (a direction to the center of winding core 12 in X-axis direction) in X-axis direction, are provided at both ends in Y-axis direction of outer end faces 14a1, 14a1 of flange parts 14a, 14a. The latter mentioned terminal fitting part 42 of electrode film 40 is provided to each step face 14a2, 14a2. A depth of the step in X-axis direction of each step face 14a2, 14a2 is preferably approximately the same with a thickness of the latter mentioned metal terminal 50, however, they may be the different. The thickness of metal terminal 50 is preferably 50 to 200 μm.

The first flat surfaces 14a3, 14a3 are respectively formed on the upper surface of flange parts 14a, 14a in Z-axis direction. Plate member 20 is provided on each first flat surface 14a3, 14a3.

Cutout part 21 is formed at the four corners inside of plate member 20. Thus, there becomes a gap between the four corners inside of plate member 20 and the first flat surfaces 14a3, 14a3, when plate member 20 is set at flange parts 14a, 14a. Therefore, when plate member 20 is set at flange parts 14a, 14a, a connection of wire connecting part 41 will not be affected by a contact between the four corners inside of plate member 20 and wire connecting part 41.

Note, each width of the cutout of cutout part 21 in X-axis direction, Y-axis direction and Z-axis direction is not particularly limited as long as a contact with wire connecting part 41 can be avoided. In addition, the outer shape of cutout part 21 seen from Z-axis direction is not particularly limited, and may be a quadrangle, a fan-shaped, and etc.

Figure 2:
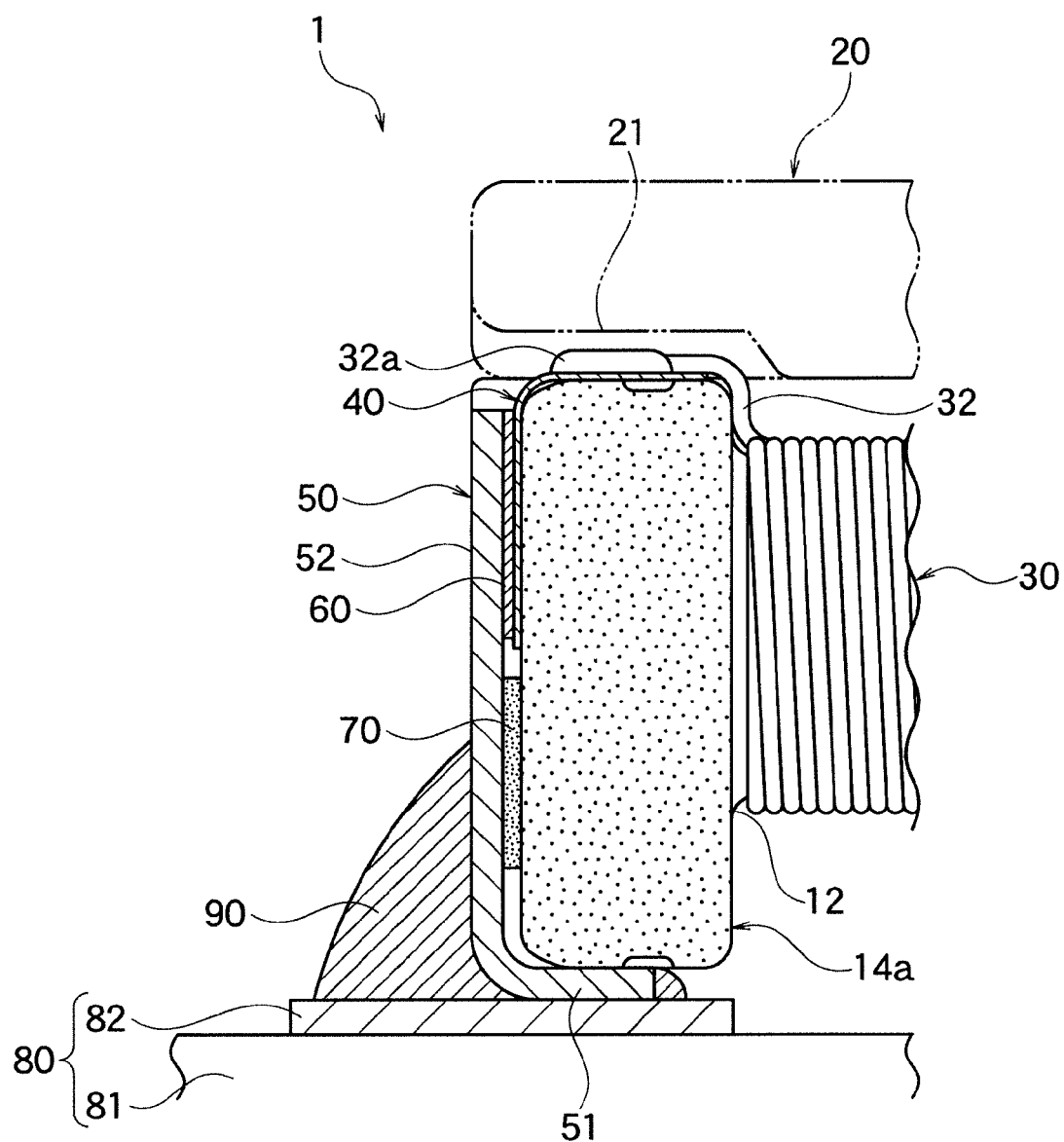
FIG. 2 is a part of a cross sectional front view according to the coil device shown in FIG. 1A, seen from the direction of II-II line.

On each lower surface of flange part 14a, 14a in Z-axis direction, the second flat surfaces 14a4, 14a4 are formed. Second flat surfaces 14a4, 14a4 become a mounting face, an installation surface, when mounting coil device 1 on such as circuit board 80 shown in FIG. 2. FIG. 2 shows that circuit board 80 includes board body 81 and electrode (land) 82, which is formed on the surface of board body 81.

As shown in FIG. 1A, electrode film 40 is formed on one flange part 14a of drum core 10 in Y-axis direction with a prescribed gap. Similarly, electrode film 40 is formed on the other flange part 14a in Y-axis direction with a prescribed gap. As an example shown in FIG. 1A, electrode film 40 is formed over the first flat surfaces 14a3, 14a3, and over each step faces 14a2, 14a2. Gap between adjacent electrode films 40 is not particularly limited, as long as it can secure the insulation.

According to the present embodiment, electrode film 40 includes wire connecting part 41 parallel to XY plane and terminal fitting part 42 parallel to YZ plane, and they are electrically connected. Wire connecting part 41 is formed on both ends of the first flat surfaces 14a3, 14a3 of flange parts 14a, 14a in Y-axis direction. Terminal fitting part 42 is formed on the upper part of step faces 14a2, 14a2 of flange parts 14a, 14a in Z-axis direction. The latter mentioned non-conductive adhesion member 70 is coated at the lower part of step faces 14a2, 14a2 in Z-axis direction.

Wire connecting part 41 of electrode film 40 is a bonding part where wire edges 31a, 32a of wires 31, 32 composing coil part 30 are bonded. Namely, each wire edges 31a, 31b of the first wire 31 is bonded to wire connecting part 41 of each electrode film 40 formed at an end side of flange parts 14a, 14a in Y-axis direction. In addition, each wire edge 32a, 32b of the second wire 32 is connected to wire connecting part 41 of each electrode film 40 formed at the other end side of flange parts 14a, 14a in Y-axis direction.

According to the present embodiment, mounting assistance part 52 of the latter mentioned metal terminal 50 is fixed to the surface of terminal fitting part 42 of each electrode film 40, apart from and approximately vertical to wire connecting part 41 of each electrode film 40, and metal terminal 50 does not coat wire connecting part 41. According to the present embodiment, a length of terminal fitting part 42 of each electrode film 40 in Z-axis direction is approximately ¼ to ⅔ of step faces 14a2, 14a2 of flange parts 14a, 14a. Namely, terminal fitting part 42 is formed in an area at about ¼ to ⅔ from the upper side of step faces 14a2, 14a2

Electrode film 40 is composed of such as a metal paste firing film or a metal plating film. Electrode film 40 is formed by coating such as Ag paste on the surface of step faces 14a2, 14a2 and the first flat surfaces 14a3, 14a3 of flange parts 14a, 14a, firing thereof, and forming a plate film by applying such as an electro plating or an electroless plating.

A material of metal paste is not particularly limited, and it can exemplify Cu paste, Ag paste, and etc. Plating film can be a layer or a multilayer, and exemplifies a plating film such as Cu plating, Ni plating, Sn plating, Ni—Sn plating, Cu—Ni—Sn plating, Ni—Au plating, Au plating, and etc. Thickness of electrode film 40 is not particularly limited, however, it is preferably 0.1 to 15 μm.

A pair of metal terminal 50 is formed on one flange part 14a of drum core 10 in Y-axis direction with a prescribed gap. Similarly, pair of metal terminal 50 is formed on the other flange part 14a in Y-axis direction with a prescribed gap. Gap between adjacent metal terminal 50 is not particularly limited, as long as it can secure the insulation.

Metal terminal 50 is composed of a metal tool having an approximately L-shaped outer foam when seen from Y-axis direction, and includes mounting part 51 parallel to XY plane and mounting assistance part 52 parallel to YZ plane. Mounting assistance part 52 is arranged at step faces 14a2, 14a2 of flange parts 14a, 14a, and fixed to step faces 14a2, 14a2.

Mounting part 51 is bonded to the circuit board. As shown in FIG. 2, mounting part 51 becomes a solder bonding surface bonded to electrode 82 of circuit board 80, when mounting coil device 1 on such as circuit board 80. Mounting part 51 is disposed to contact the second flat surfaces 14a4, 14a4 provided at both ends of flange parts 14a, 14a in Y-axis direction.

When manufacturing coil device 1, a drum type drum core 10, plate member 20, wires 31, 32, and metal terminal 50 are prepared at first. Drum core 10 and plate member 20 are composed of a separate magnetic body member. Said materials are preferably the same, however, they can be composed of a different magnetic body material.

Shown in FIG. 1A, metal terminal 50 bend to have an approximately L-shape is formed by applying a bending process to a band shaped metal plate mainly having phosphorus, copper, tin, iron, zin, and etc., such as phosphor bronze and brass.

Magnetic material having a relatively high permeability such as Ni—Zn based ferrite, Mn—Zn based ferrite, metal magnetic body, and etc. are exemplified as the materials of the magnetic body. By molding and sintering the powder of such magnetic materials, drum core 10 and plate member 20 are manufactured. Winding core 12 and flange parts 14a, 14a are integrally molded to drum core 10.

Next, a metal paste is coated on flange parts 14a, 14a of drum core 10, and fired at a predetermined temperature. Electrode film 40 is formed by applying electro plating or electroless plating on the surface thereof.

Subsequently, drum core 10, on which electrode film 40 is formed, wire 31, and wire 32 are set at a winding machine. Accordingly, winding core 12 of drum core 10 is wound with wire 31 and wire 32 by a predetermined order. A core material composed of a good conductor such as copper Cu, coated with an insulating material made by such as imido denatured polyurethane, and the outermost surface thereof is further coated with a thin resin film such as polyester, can be used as wire 31 and wire 32.

Subsequently, metal terminal 50 is adhered to flange part 14a. During the adhesion, conductive adhesion member 60 is preliminary coated inside and on the upper part in Z-axis direction of mounting assistance part 52 of metal terminal 50, and nonconductive adhesion member 70 is coated inside and on the lower part in Z-axis direction of the same. Then, metal terminal 50 contacts flange part 14a and adhered.

Possibly, conductive adhesion member 60 is preliminary coated on terminal fitting part 42 of electrode film 40 and nonconductive adhesion member 70 is further preliminary coated on the lower part in Z-axis direction of step faces 14a2, 14a2 of flange parts 14a, 14a, and metal terminal 50 may contact from the top thereof and adhered.

Accordingly, mounting assistance part 52 of metal terminal 50 is adhered and fixed to terminal fitting part 42 of electrode film 40 and step face 14a2 of flange part 14a. Resin used as nonconductive adhesion member 70 is not particularly limited, however, epoxy resin, phenolic resin, acrylic resin, polyester resin, polyimide, polyamide-imide, silicone resin, the mixture thereof, and etc. are exemplified. Conductive adhesion member 60 is not particularly limited, however, epoxy resin, bisphenol, dichlorophenyl, dimethylurea, butadiene acrylonitrile copolymer, and etc. including conducting particles such as silver are used.

Next, wire edges 31a, 31b, 32a, 32b of each wire 31, 32 are bonded to wire connecting part 41 of electrode film 40. The bonding method is not particularly limited, however, for instance, a heater chip is pressed to electrode film 40 having wire edges 31a, 31b, 32a, 32b in between, and wire edges 31a, 31b, 32a, 32b are thermocompressed to each electrode film 40. Note, an insulating material coating the core wire of wires 31, 32, melts by the heat during thermocompression. Thus, wire 31, 32 do not require the removal of the coating film.

According to the present embodiment, coil device 1 includes electrode film 40, including wire connecting part 41 where wire edge 31a, 31b, 32a, 32b of wires 31, 32 composing coil part 10 are bonded, and metal terminal 50, connected to terminal fitting part 42 formed on the surface of electrode film 40 apart from wire connecting part 40. At wire connecting part 41 of electrode film 40, wire edges 31a, 31b, 32a, 32b can be electrically bonded and fixed by such as thermocompression. Further, at terminal fitting part 42 of electrode film 40 apart from wire connecting part 41, metal terminal 50 can be preferably connected to electrode film 40 by solder or conductive adhesion member 60.

Thus, mounting part 51 of metal terminal 50 can be soldered to such as circuit board 80 shown in FIG. 2, apart from wire connecting part 41 of electrode film 40. Therefore, solderability is good at mounting part 51 of metal terminal 50, and bonding strength between mounting part 51 of metal terminal 50 and circuit board 80 is enhanced.

Metal terminal 50 includes mounting part 51, which faces and connects the surface of circuit board 80, and mounting assistance part 52, continuous to mounting part 51 and bent to an approximately vertical direction. Inner side of mounting assistance part 52 is bonded to terminal fitting part 42 of electrode film 40. And as shown in FIG. 2, solder fillets are formed at external face of mounting assistance part 52 on the lower part in Z-axis direction when bonding mounting part 51 to circuit board 80 by solder 90, and reliability of bonding part of metal terminal 50 to circuit board 80 improves.

Such configuration makes coil device 1 to fall off from circuit board 80 and can effectively avoid the generation of mounting defect.

Note, in case when a crack is generated on the bonding surface of solder 90, it will not affect wire connecting part 41, physically separated from mounting part 51. There is a few risk for disconnection of wires 31, 32 at wire connecting part 41. Thus, it becomes possible to prolong a product life of coil device 1.

According to coil device 1 of the embodiment, it is capable to widen an area of the mounting part relative to conventional ones, in which wire edges are directly bonded to the metal terminal. Therefore, bonding strength of solder can be highly secured. Therefore, coil device of the present embodiment is capable to maintain a high reliability, even when reduction in size and height are further progressed in the future.

The following results were obtained by a heat cycle test (a thermal shock test) of coil device 1 by the present inventors. According to the coil device of a conventional technique type, a crack was generated on a bonding surface of solder and coil was disconnected, when a cycle number reached 471 times. On the other hand, according to coil device 1 of the embodiment, crack did not generate on the bonding face of the solder and disconnection did not generate till the cycle number reached 5,000 to 7,000 times. Namely, coil device 1 of the present embodiment provides a cycle number of approximately 10 to 13 times, in relative to the same of the conventional coil device, and a product life of the coil device is remarkably improved.

As shown in FIG. 1A, metal terminal 50 is fixed to flange part 14a by nonconductive adhesion member 70 at a place where electrode film 40 is not formed. Metal terminal 50 is fixed and bonded to terminal fitting part 42 of electrode film 40 by such as conductive adhesion member 60, however, bond fixing between metal terminal 50 and electrode film 40 and fixing between metal terminal 50 and flange part 14a can be reinforced by further fixing metal terminal 50 to lower part of step face 14a2 of flange part 14a by nonconductive adhesion member 70.

Coil device 1 further includes plate member 20 having a flat external face. Thus, the flat external face of plate member 20 becomes an adsorption surface for moving coil device 1. And for instance, it is easy to convey coil device 1 on circuit board 80 by the adsorption conveyance device when mounting on circuit board 80. Plate member 20 may be composed of a magnetic body, similar to drum core 10 composed of the magnetic body. In this case, drum core 10 composes a closed magnetic path and improves inductance of coil device 1.

According to the present embodiment, as shown in FIG. 1A, wire connecting part 41 of electrode film 40 is formed on the first flat surface 14a3, which is an opposite side of the second flat surface 14a4 where mounting part 51 is disposed. With the configuration above, wire connecting part 41 is disposed at a place sufficiently separated from the disposed position of mounting part 51, and there is a sufficient gap between wire connecting part 41 and mounting part 51. Therefore, the solder becomes difficult to adhere to wire connecting part 41 when reflow soldering coil device 1 on circuit board 80, and it can prevent wire connecting part 41 to contact circuit board 80 or any obstacle. Thus, disconnection of wires 31, 32 at wire connecting part 41 can be effectively prevented. Thus, a reliability of coil device 1 can be enhanced also at this point.

After soldering coil device 1 on circuit board 80, wire connecting part 41 can be visually recognized, and it becomes possible to confirm the existence of disconnection of wire connecting part 41.

According to coil device 1 of the present embodiment, step faces 14a2, 14a2 are formed at a recessed place in X-axis direction than end faces 14a1, 14a1 of flange parts 14a, 14a, and mounting assistance part 52 of metal terminal 50 is adhered and fixed to step faces 14a2, 14a2. End faces 14a1, 14a1 become approximately flush with an upper face of mounting assistance part 52, to which step faces 14a2, 14a2 are adhered and fixed. Considering above, unnecessarily projection to X-axis direction from flange parts 14a, 14a can be prevented.

Formation of electrode film 40 can be suitably varied according to coil device 1 of the present embodiment. For instance, similar to electrode film 40A shown in FIG. 1B, a width in Y-axis direction of wire connecting part 41A can be extended to a predetermined width toward a center in Y-axis direction. With the configuration above, as shown in FIG. 1B, connection places of wire edges 31a, 31b, 32a, 32b can be moved to a center place in Y-axis direction, and connection places (formation of wire connecting part 41A) of wire edges 31a, 31b, 32a, 32b can be optimized, depending on the mounting environment.

Figure 1B:
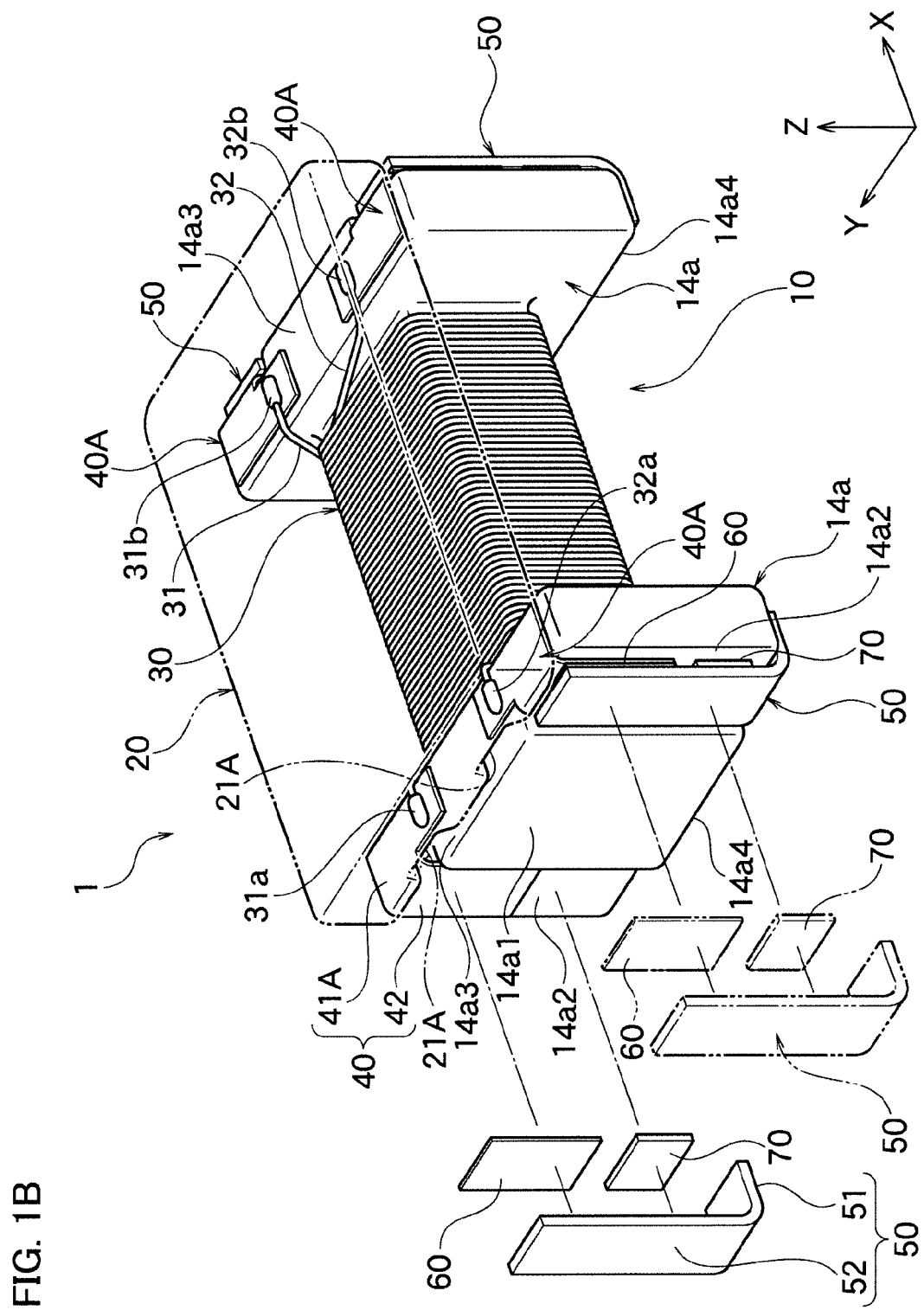
FIG. 1B is an entire perspective view of a modified example according to the coil device shown in FIG. 1A.

However, as shown in FIG. 1B, in case when the connection places of wire edges 31a, 31b, 32a, 32b are moved to the center place in Y-axis direction, a formation place of cutout part 21A of plate member 20 is preferably moved to the center place in Y-axis direction.

Figure 1C:
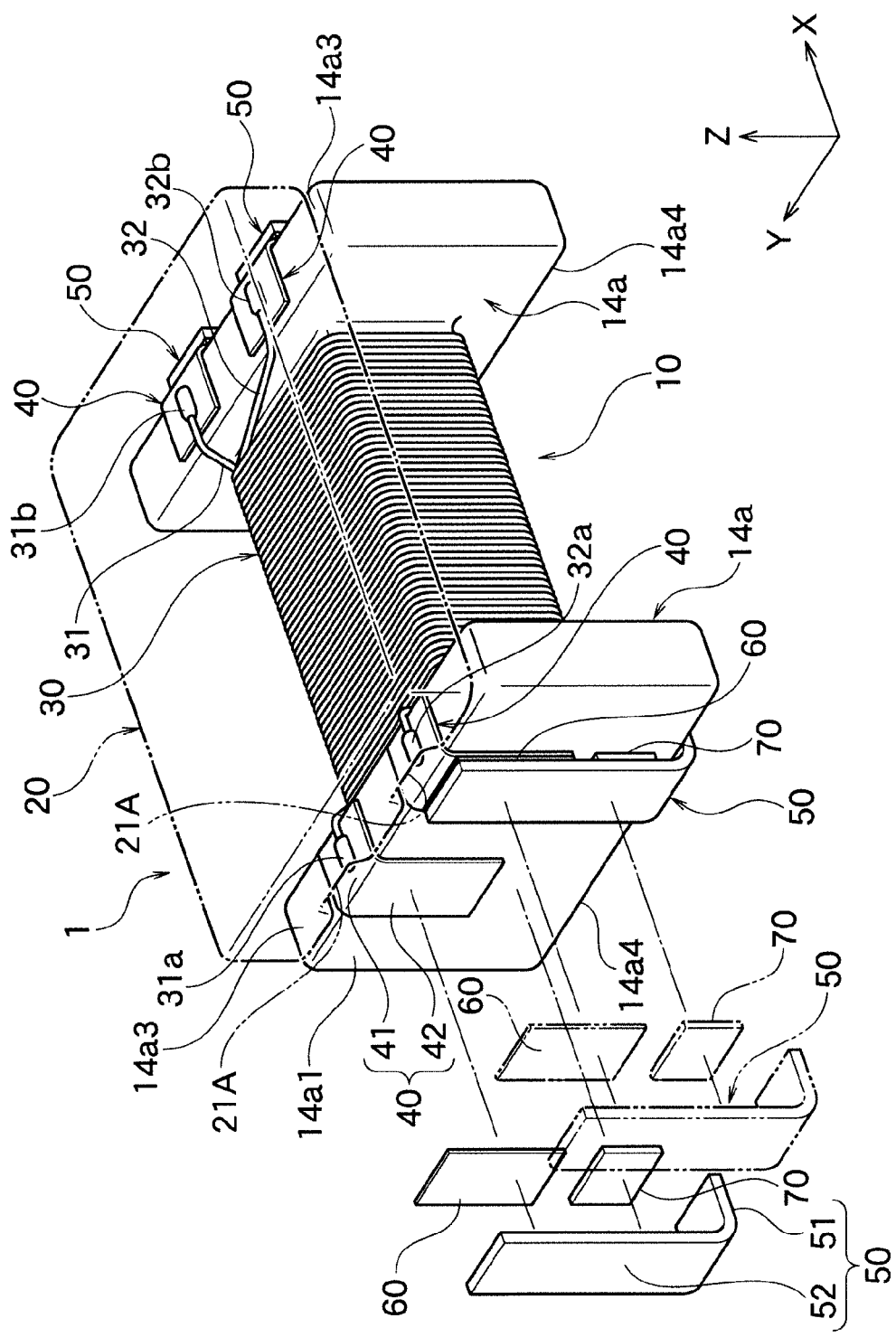
FIG. 1C is an entire perspective view of the other modified example according to the coil device shown in FIG. 1A.

Formation place of electrode film 40 can be suitably varied in coil device 1 of the present embodiment. For instance, as shown in FIG. 1C, the formation place of electrode film 40 can be moved by a predetermined width toward center part in Y-axis direction. With the configuration above, the formation place of electrode film 40 can be optimized depending on the mounting environment.

As shown in FIG. 1B, in case when the formation place of electrode film 40 is moved toward center part in Y-axis direction, depending on an amount of the movement, a fixing place of metal terminal 50 and a formation place of cutout part 21A of plate member 20 are required to move toward center part in Y-axis direction.

As shown in FIG. 1C, in case when electrode film 40 is formed at the center part in Y-axis direction, step faces 14a2, 14a2 shown in FIG. 1A or FIG. 1B at end faces 14a1, 14a1 are not required.

The Second Embodiment

Figure 3A:
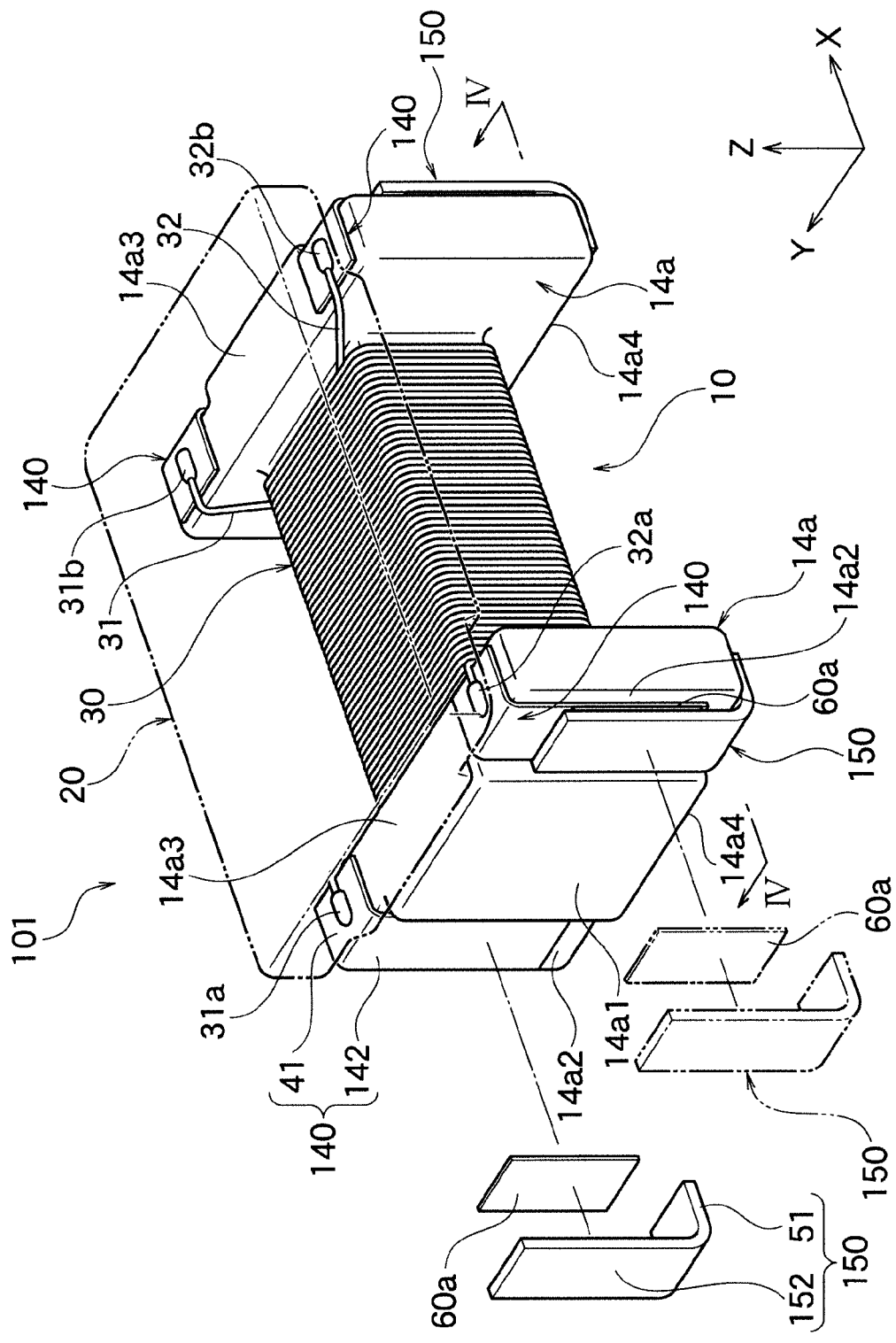
FIG. 3A is an entire perspective view according to the coil device of the other embodiment of the invention.

As shown in FIG. 3A, coil device 101 according to the second embodiment of the invention only differ in the following points, and the other compositions are similar to the same according to first embodiment described above. According to the members in figures, a common symbol is attached to the common part and an overlapped explanation is omitted.

According to the present embodiment, a length of terminal fitting part 142 of electrode film 140 in Z-axis direction is longer than the same of terminal fitting part 42 of electrode film 40 in Z-axis direction of the first embodiment. As an example shown in FIGS. 3A and 4, lower part of terminal fitting part 142 in Z-axis direction extends close to a lower side end of step face 14a2 in Z-axis direction. Note, according to the present embodiment, length of terminal fitting part 142 from the first flat surface 14a3 in Z-axis direction is 50% or more of the length of step faces 14a2 in Z-axis direction, and preferably approximately 65 to 90% of the same.

According to the present embodiment, a length of mounting assistance part 152 of metal terminal 150 in Z-axis direction is shorter than the same of mounting assistance part 52 of metal terminal 50 in Z-axis direction according to the first embodiment. As an example shown in FIG. 3A and FIG. 4, the upper end of mounting assistance part 152 in Z-axis direction is adhered and fixed at a lower side than the upper end of step face 14a2 in Z-axis direction. A length of mounting assistance part 152 from the second flat surface 14a4 in Z-axis direction is 100% or less of the length of step face 14a2 in Z-axis direction, and preferably approximately 40 to 75% of the same. The length of step faces 14a2 in Z-axis direction is not excessively small, and thus, fillet of solder 90 shown in FIG. 4 can be formed to a sufficient height.

According to the present embodiment, bonding between metal terminal 150 and flange parts 14a, 14a is performed only by solder 60a. Namely, mounting assistance part 152 of metal terminal 150 is bonded and fixed to terminal fitting part 142 of electrode film 140 by solder 60a without using nonconductive adhesion member 70 of the first embodiment.

Figure 4:
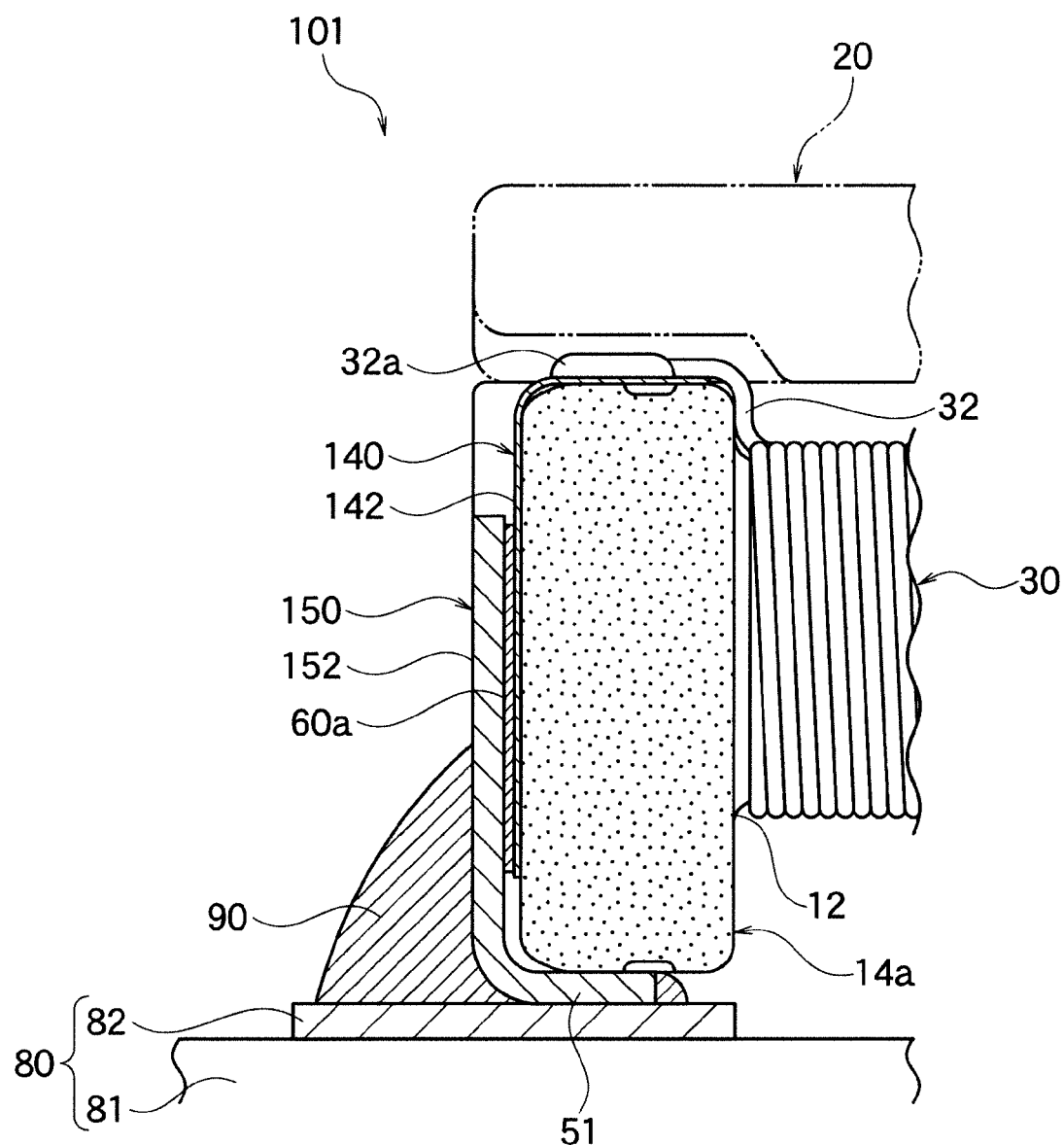
FIG. 4 is a part of a cross sectional front view according to the coil device shown in FIG. 3A, seen from the direction of IV-IV line.

Lower part of terminal fitting part 142 in Z-axis direction extends close to a lower side end of step face 14a2 in Z-axis direction. In addition, solder 60a exists between terminal fitting part 142 of electrode film 140 and mounting assistance part 152 of metal terminal 150. Therefore, as shown in FIG. 4, in case when coil device 101 is attached to circuit board 80 by solder 90, solder 60a between terminal fitting part 142 and mounting assistance part 152 and solder 90 for mounting circuit board 80 can be unified. Thus, according to the present embodiment, metal terminal 150 is firmly fixed to flange part 14a, while coil device 101 is firmly bonded to circuit board 80.

Coil device 101 of the embodiment does not require nonconductive adhesion member 70 of the first embodiment, thus, manufacturing process of coil device 101 can be simplified.

Figure 3B:
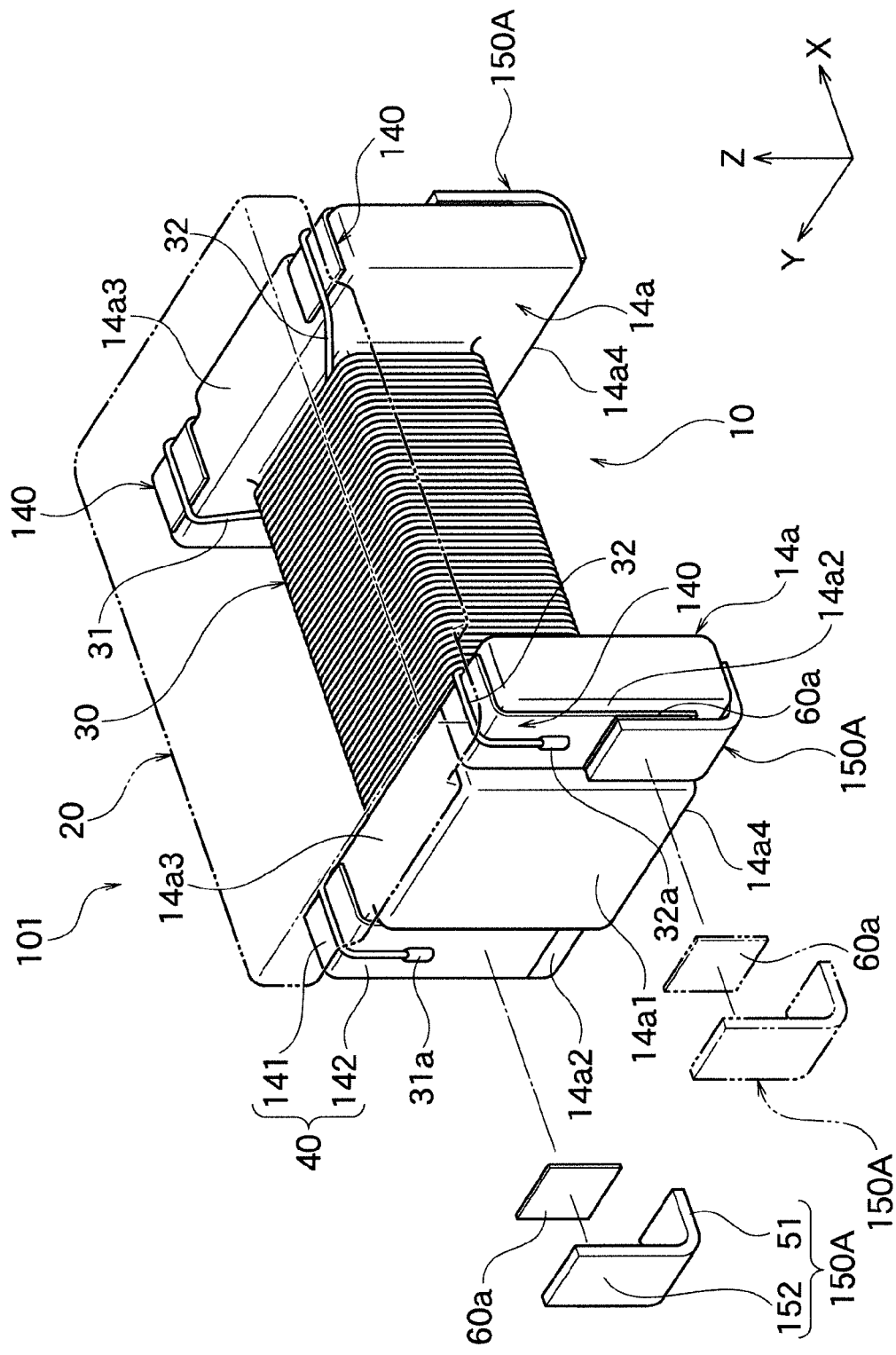
FIG. 3B is an entire perspective view of a modified example according to the coil device shown in FIG. 3A.

As shown in FIG. 3B, in case when length of mounting assistance part 152A of metal terminal 150 in Z-axis direction is made approximately 60% or less of a length of step faces 14a2, 14a2 in Z-axis direction, a space where mounting assistance part 152A is not bonded is formed at the upper side of terminal fitting part 142 of electrode film 140 in Z-axis direction. Thus, the space of electrode film 140 can be determined as the wire connecting part 141, and wire edges 31a, 31b, 32a, 32b can be bonded thereto. According to the present embodiment, wire connecting part 141 and terminal fitting part 142 are disposed on step face 14a2, and are adjacent in Z-axis direction.

According to the embodiment shown in FIG. 3B, wire connecting part 141 of electrode film 140 is continuous from terminal fitting part 142 and forms L-shape from step face 14a2 to the first flat surface 14a3, however, electrode film 140 may not be formed on the first flat surface 14a3. Namely, according to the embodiment shown in FIG. 3B, wire connecting part 141 of electrode film 140 can be only formed on step faces 14a2 continuously from terminal fitting part 142.

The Third Embodiment

Figure 5A:
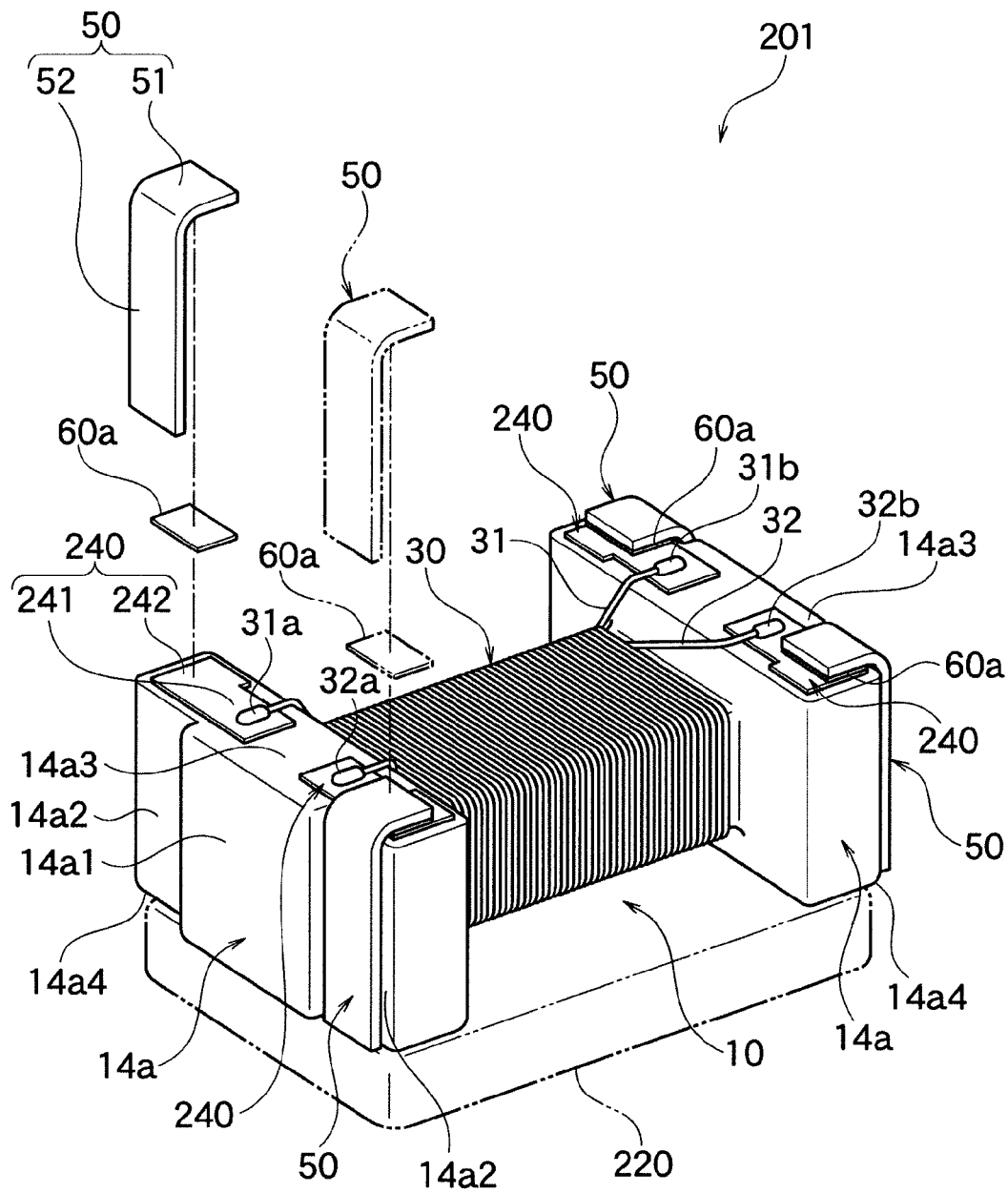
FIG. 5A is an entire perspective view of the coil device according to the other embodiment of the invention.

As shown in FIG. 5A, coil device 201 according to the third embodiment of the invention only differ in the following points. The other compositions are similar to the same according to first and the second embodiments described above. According to the members in figures, a common symbol is attached to the common part and an overlapped explanation is omitted.

According to the present embodiment, firstly, the formation of electrode film 240 differs from the same of electrode film 40 of the first embodiment. As shown in FIG. 5A of the embodiment, wire connecting part 241 of electrode film 240 and terminal fitting part 242 are disposed on the same first flat surface 14a3 of flange part 14a. Terminal fitting part 242 is set slightly wider in X-axis direction and formed continuously to wire connecting part 241 formed slightly narrower in X-axis direction. Wire edges 31a, 31b, 32a, 32b are connected to wire connecting part 241 of each electrode film 240.

Inner face of mounting part 51 of metal terminal 50 is bonded to terminal fitting part 242 of each electrode film 240 by solder 60a or a conductive adhesive. Mounting assistance part 52 is continuously formed to mounting part 51 of metal terminal 50, similar to the first embodiment, however, mounting assistance part 52 may not be bonded to step face 14a2. External face of mounting part 51 may be faced to the surface of circuit board 80 and bonded to electrode 82, similar to FIG. 4. Fillet of solder 90 may be formed on the external face of mounting assistance part 52.

According to the present embodiment, plate member 220 is adhered or fixed by the other means to the second flat faces 14a4, 14a4 of the flange parts 14a, 14a. Different from plate member 20 shown in FIG. 1A, cutout part 21 is not required to be formed at inside four corners of plate member 220 in Z-axis direction. Electrode film 240 of the present embodiment is formed on the first flat surfaces 14a3, 14a3, and that plate member 220 does not contact wire connecting part 240. Thus, it is not required to form a gap between the second flat faces 14a4, 14a4 and the inside four corners of plate member 220 in Z-axis direction.

According to coil device 201 of the present embodiment, electrode film 240 is not exposed to outer side. Thus, generation of such as disconnection of wire edges 31a, 31b, 32a, 32b due to electrode film 240 contacting any obstacle can be effectively prevented, after reflow soldering coil device 201 to circuit board 80.

In addition, on the first flat surface 14a3 of flange part 14a, wire connecting part 241 of electrode film 240 is arranged to be adjacent to mounting part 51 of metal terminal 50. Thus, a distance between wire connecting part 241 and terminal fitting part 242 of electrode film 240 is shortened, and it can prevent an unnecessary increase of electrode film 240 area.

According to the present embodiment, a pair of metal terminals 50 are provided on each flange part 14a, and a pair of wire connecting parts 241 are disposed between a pair of the mounting parts 51 respectively formed on the pair of the metal terminals 50. With the configuration above, an insulating distance between a pair of metal terminals 50 can be lengthened.

Figure 5B:
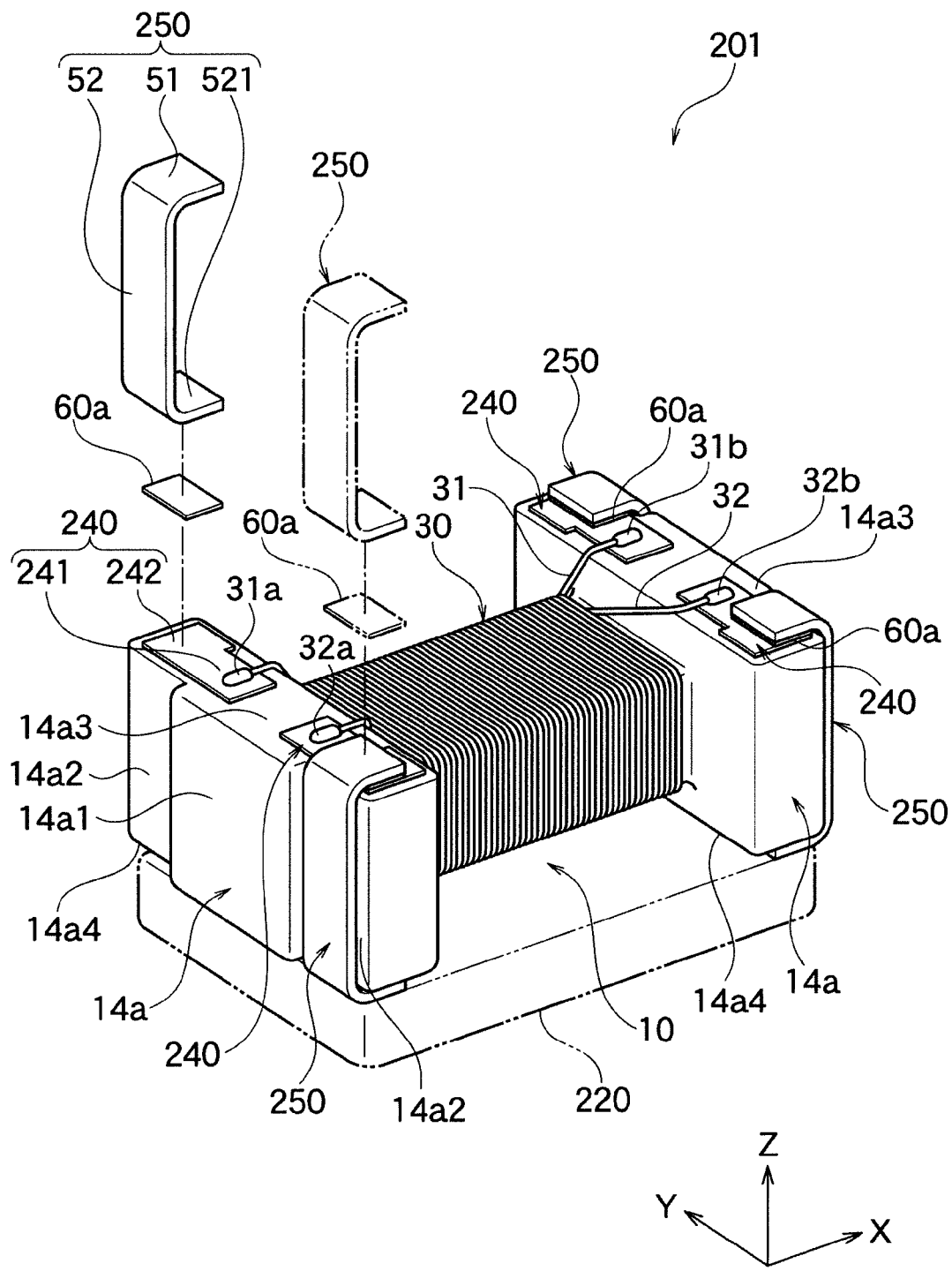
FIG. 5B is an entire perspective view of a modified example according to the coil device shown in FIG. 5A.

According to metal terminal 250 shown in FIG. 5B, a lower part of mounting assistance part 52 of metal terminal 50 shown in FIG. 5A in Z-axis direction is bent to X-axis direction, and engagement part 521 can be provided to metal terminal 250. Engagement part 521 of metal terminal 250 has the same shape and the size with mounting part 51, and faces mounting part 51 in Z-axis direction. With the configuration above, it becomes possible to sandwich the first flat surface 14a3 and the second flat face 14a4 of flange parts 14a, 14a with mounting part 51 and engagement part 521 of metal terminal 250, and it becomes possible to firmly fix metal terminal 250 and flange part 14a.

Figure 5C:
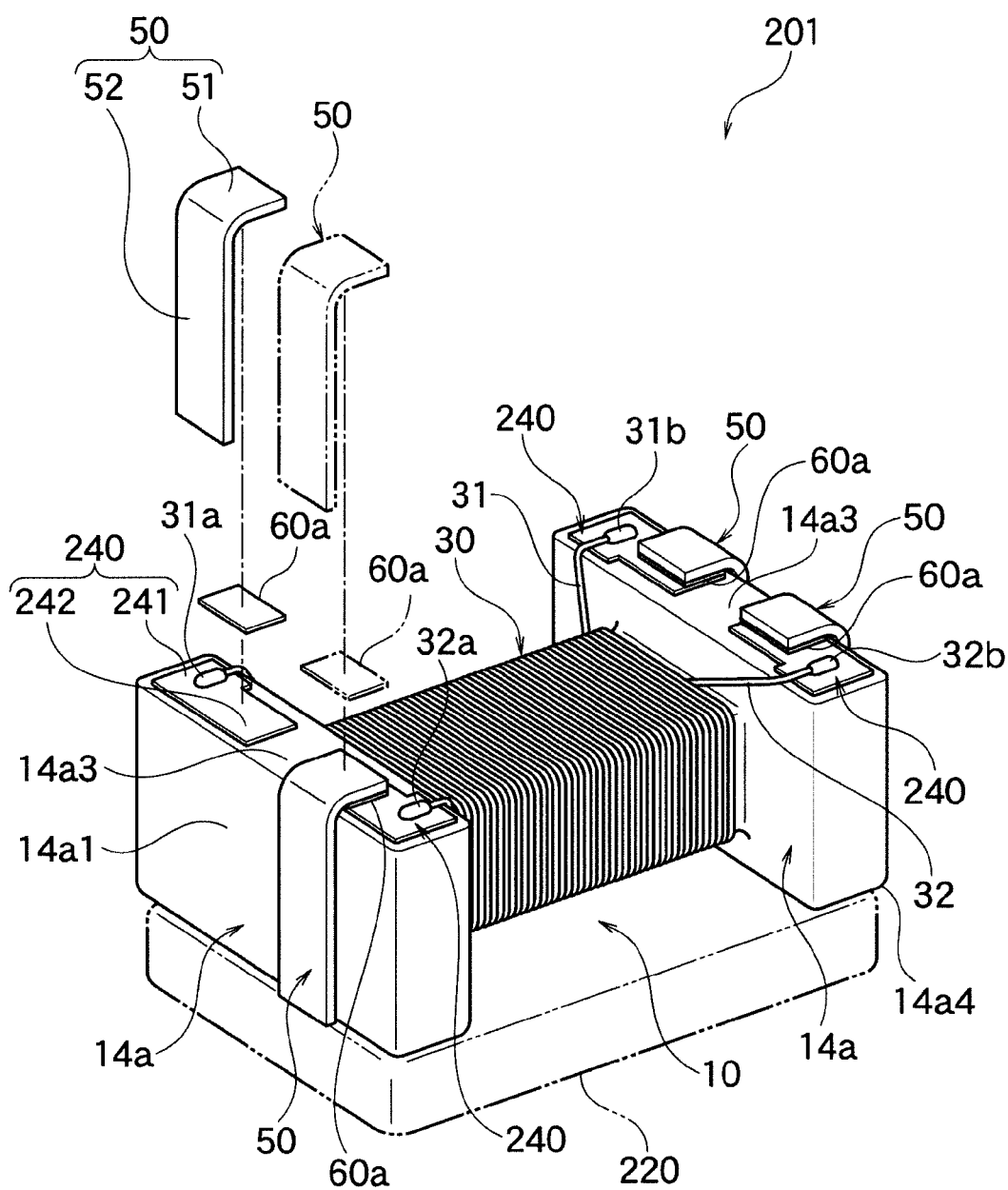
FIG. 5C is an entire perspective view of the other modified example according to the coil device shown in FIG. 5A.

Fixing position of metal terminal 50 can be suitably changed according to coil device 201 of the present embodiment. For instance, as shown in FIG. 5C, the fixing position of metal terminal 50 can be moved with a predetermined width toward center part, inner side, in Y-axis direction.

In this case, however, mounting part 51 of metal terminal 50 is connected and fixed to terminal fitting part 242, disposed inside electrode film 240 in Y-axis direction, and wire edges 31a, 31b, 32a, 32b are bonded and fixed to wire connecting part 241 disposed at outer side of each electrode film 240 in Y-axis direction. As shown in FIG. 5C, step face 14a2 shown in FIG. 5A becomes not necessary at end face 14a1, when fixing metal terminal 50 at the center side in Y-axis direction.

With the configuration above, the fixing position of metal terminal 50 can be optimized depending on the mounting environment.

The Fourth Embodiment

Figure 6A:
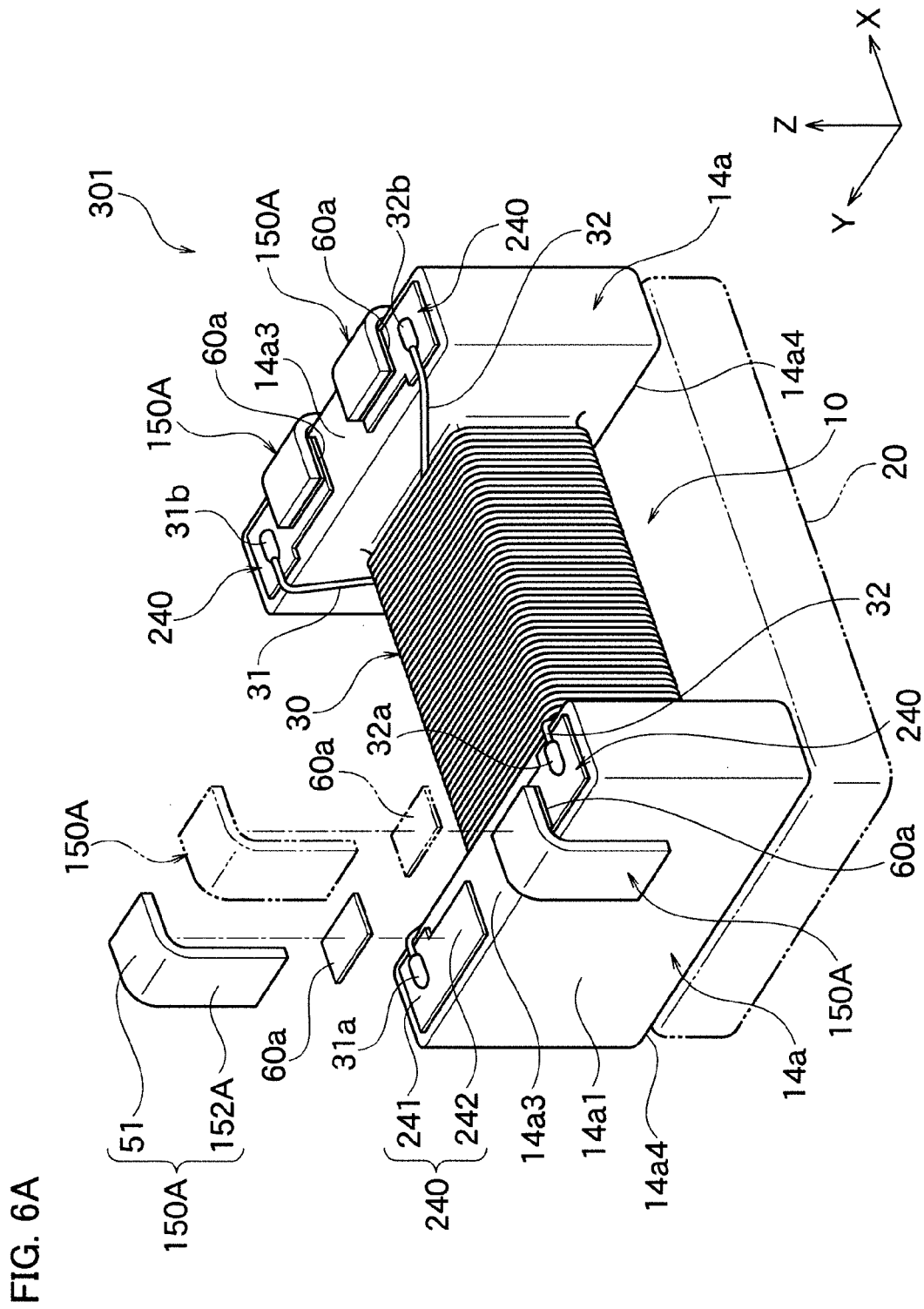
FIG. 6A is an entire perspective view of the coil device according to the other embodiment of the invention.

As shown in FIG. 6A, coil device 301 according to the fourth embodiment of the invention only differ in the following points. The other compositions are similar to the same according to first to the third embodiments described above. According to the members in figures, a common symbol is attached to the common part and an overlapped explanation is omitted.

Coil device 301 of the present embodiment is similar to the embodiment shown in FIG. 5C, except metal terminal 50 shown in FIG. 5C is replaced with metal terminal 150A of coil device 101 shown in FIG. 3B. Namely, according to the present embodiment, a length of mounting assistance part 152A of metal terminal 150A in Z axis direction is relatively shorter than a length of mounting assistance part 52 of metal terminal 50 shown in FIG. 5C.

Figure 6B:
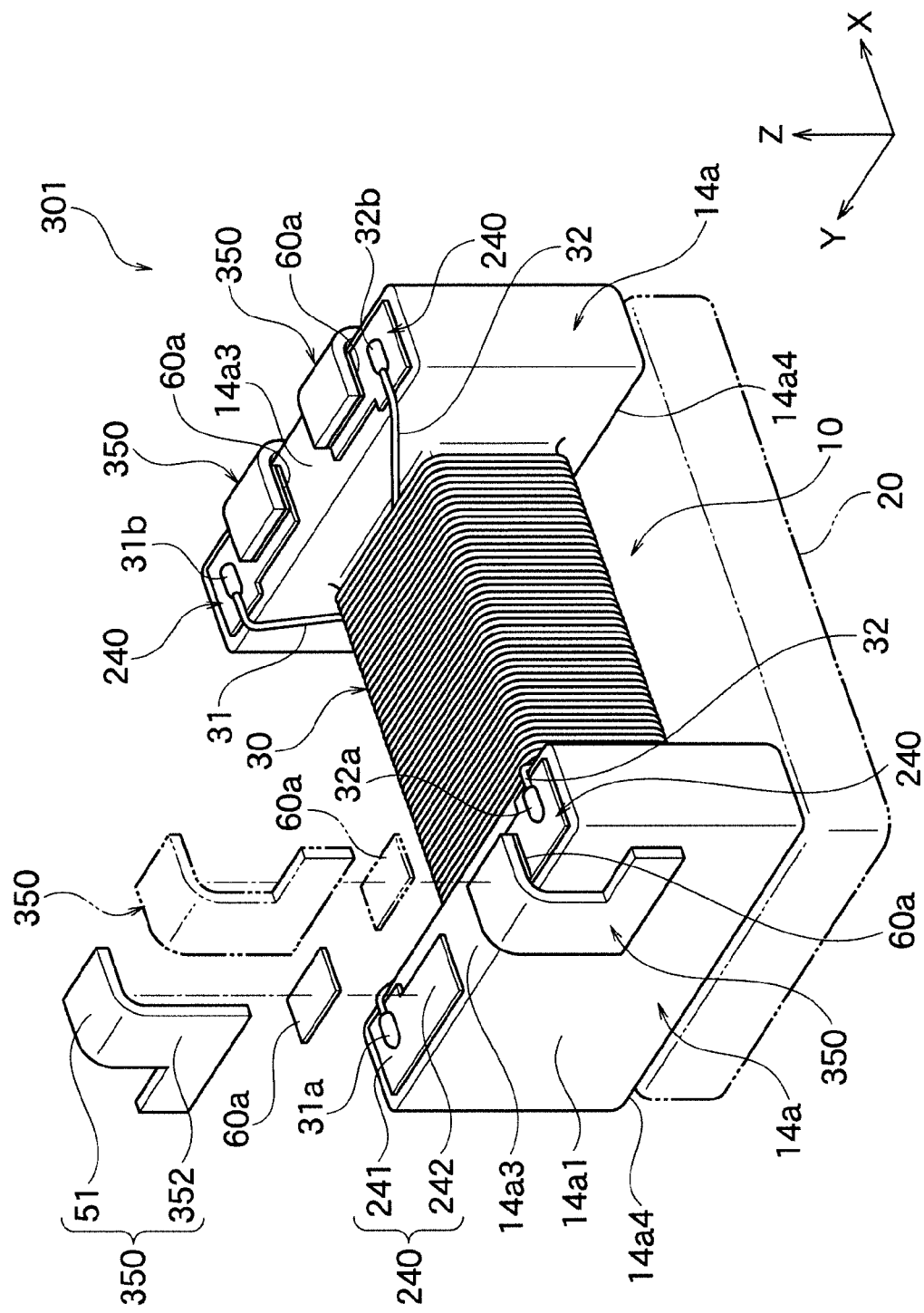
FIG. 6B is an entire perspective view of a modified example according to the coil device shown in FIG. 6A.

Note, according to the present embodiment, as shown in metal terminal 350 shown in FIG. 6B, a lower part of mounting assistance part 152A of metal terminal 150 shown in FIG. 6A may be formed wider in Y-axis direction. Mounting assistance part 352 of metal terminal 350 has approximately L-shaped outer foam when seen from X-axis direction, however, it may be a rectangle having uniform Y-axis direction width (Y-axis direction width wider than mounting part 51) in Z-axis direction.

The invention is not limited to the embodiments described above and can be varied within the scope of the invention. For instance, as an example shown in FIG. 1A and FIG. 3A, mounting part 51 contacts the second flat surfaces 14a4, 14a4, however, they can be separated.

NUMERICAL REFERENCES 1, 101, 201, 301 . . . coil device
10, 110 . . . drum core
   12 . . . winding core
   14a . . . flange part
      14a1 . . . end face
      14a2 . . . step face
      14a3 . . . the first flat surface
      14a4 . . . the second flat surface
20, 220 . . . plate member
   21, 21A . . . cutout part
30, 230 . . . coil part
   31 . . . the first wire
   32 . . . the second wire
      31a, 31b, 32a, 32b . . . wire edge
40, 140, 240 . . . electrode film
   41, 141, 241 . . . wire connecting part
   41, 241, 242 . . . terminal fitting part
50, 150A, 250, 350 . . . metal terminal
   51 . . . mounting part
   52, 152A, 352 . . . mounting assistance part
   521 . . . engagement part
60 . . . conductive adhesion member
   60a . . . solder
70 . . . non-conductive adhesion member
80 . . . circuit board
   81 . . . board body
   82 . . . electrode
90 . . . solder

The invention claimed is:

1. A coil device comprising:
   a core including a winding core part and a flange part provided on an edge of the winding core part,
   a coil part comprised of a wire wound on the winding core part,
   an electrode film having a wire connecting part where a wire edge of the wire is connected, and the electrode film is formed on a surface of the flange part, and
   a metal terminal is connected to a terminal fitting part and is formed on a surface of the electrode film at a place different from the wire connecting part, wherein
   the metal terminal is fixed to the flange part by an adhesion member, at a place where the electrode film is not formed.

2. The coil device according to claim 1, further comprising a plate member having a flat external face.

3. The coil device according to claim 1, wherein the metal terminal comprises:
   a mounting part faced and connected to a surface of a circuit board, and
   a mounting assistance part formed continuously from the mounting part.

4. The coil device according to claim 3, wherein the mounting part is disposed opposite to the wire connecting part respectively on the opposite sides of the flange part.

5. The coil device according to claim 3, wherein the wire connecting part is disposed adjacent to the mounting part on the same side of the flange part.

6. The coil device according to claim 5, wherein
   a pair of the metal terminals are provided on the flange part, and
   the wire connecting part is disposed between a pair of the mounting parts respectively formed on the pair of the metal terminals.

* * * * *